United States Patent
Keller et al.

[11] Patent Number: 5,631,856
[45] Date of Patent: May 20, 1997

[54] TEST SEQUENCE OPTIMIZATION PROCESS FOR A CIRCUIT TESTER

[75] Inventors: Steven A. Keller, Coral Springs; Jiann-Chang Lo, Boca Raton; James C. Mahlbacher, Lake Worth, all of Fla.

[73] Assignee: International Business Machines Corporation, Armonk, N.Y.

[21] Appl. No.: 373,338

[22] Filed: Jan. 17, 1995

[51] Int. Cl.$^6$ .................................................. G01R 15/12
[52] U.S. Cl. ........................................... 364/578; 324/758
[58] Field of Search ............................... 364/578, 488, 364/489, 490, 491, 474.37, 468.28; 324/754, 758, 761, 762, 158.1, 73.1, 519, 537

[56] References Cited

U.S. PATENT DOCUMENTS

| | | | |
|---|---|---|---|
| 4,565,966 | 1/1986 | Burr et al. | 324/519 |
| 5,023,557 | 6/1991 | Moran et al. | 324/73.1 |
| 5,155,679 | 10/1992 | Jain et al. | 364/402 |
| 5,214,746 | 5/1993 | Fogel et al. | 395/23 |
| 5,222,192 | 6/1993 | Shaefer | 395/13 |
| 5,272,638 | 12/1993 | Martin et al. | 364/444 |
| 5,418,953 | 5/1995 | Hunt et al. | 395/650 |
| 5,469,064 | 11/1995 | Kerschner et al. | 324/537 |
| 5,485,081 | 1/1996 | Whitehead et al. | 324/158.1 |
| 5,550,483 | 8/1996 | Boyette, Jr. et al. | 324/758 |

*Primary Examiner*—Kevin J. Teska
*Assistant Examiner*—Matthew Loppnow
*Attorney, Agent, or Firm*—Richard A. Tomlin; Ronald V. Davidge

[57] ABSTRACT

The sequential order of movements of a number of probes within a circuit test fixture is optimized through the use of an algorithm which sequentially orders test configurations provided in an input list. Each test configuration corresponds to the locations of probes within the fixture as a particular test is performed. In a first pass of the algorithm, for each test configuration, every other test configuration is considered as a next move candidate for which a weighted distance is calculated from the test configuration. Weighting factors reflect the degree of difficulty in moving one direction instead of another. A need to move one probe before another or to move in one direction before another, in order to prevent a collision within the test fixture, is also considered. A predetermined number of next move candidates having the lowest weighted distances are placed in an intermediate list for the test configuration. In a second pass of the algorithm, test configurations are linked, one to another, to form a list reflecting a preferred order of probe movement. In the process of linking with a test configuration, the available next move candidate having the shortest weighted distance is chosen from the intermediate list of the test configuration. If no available next move candidates remain in the intermediate list, the process returns to the first pass of the algorithm to get more next move candidates. Additionally, the algorithm is used to sequentially order individual points for a test fixture having only a single probe.

24 Claims, 9 Drawing Sheets

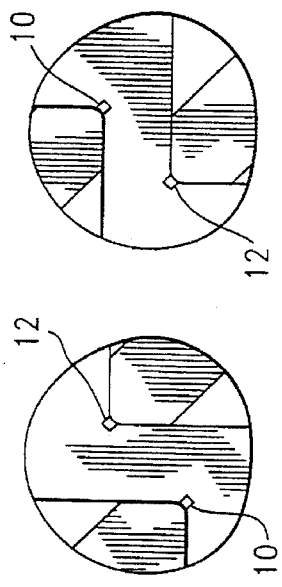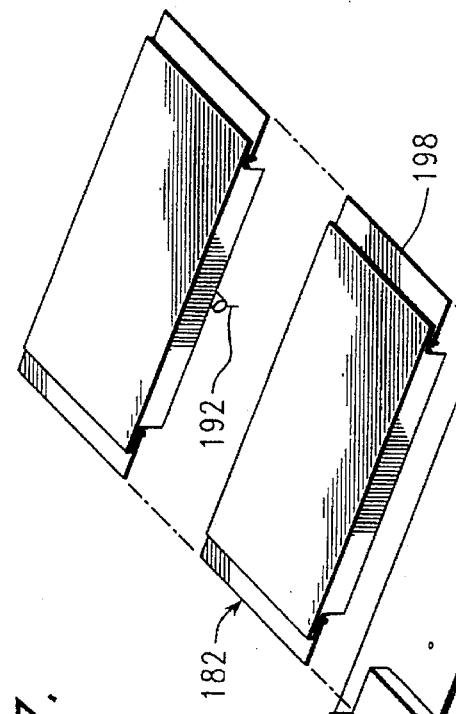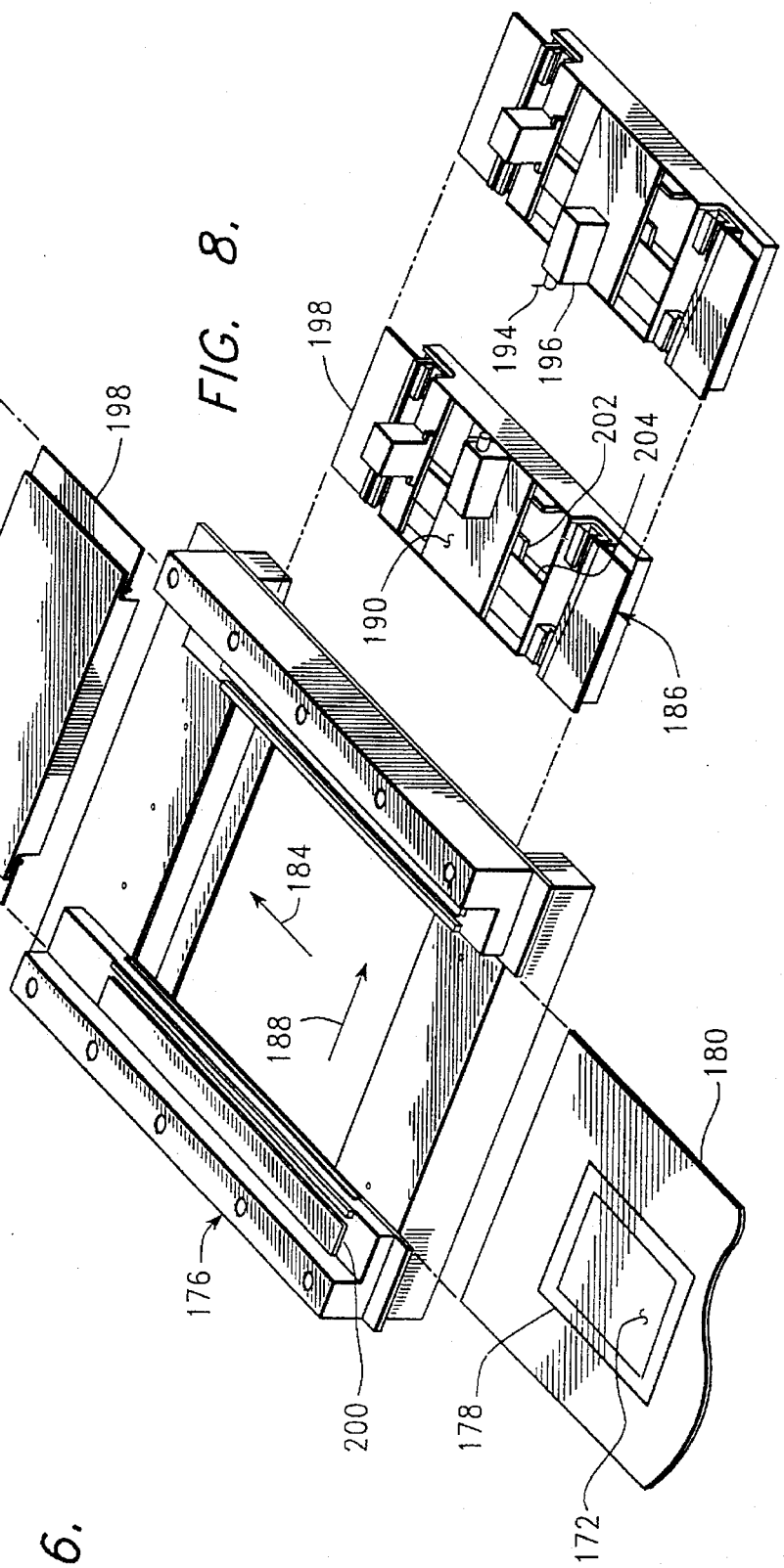

TEST SEQUENCE OPTIMIZATION PROCESS FOR A CIRCUIT TESTER

CROSS-REFERENCE TO RELATED APPLICATIONS

A co-pending U.S. application, Ser. No. 176,810, filed Jan. 3, 1994, issued as U.S. Pat. No. 5,461,324 entitled "Open Frame Gantry Probing System," by James Edward Boyette, et al., having a common assignee with the present invention, the disclosure of which is hereby incorporated by reference, describes a system for moving two test probes along each side of a printed circuit being tested, and for moving the probes into engagement with the adjacent surface of the circuit when the probes are brought to the desired locations. Each of the four probes can be moved in both (X and Y) directions perpendicular to one another but parallel to the adjacent surface of the printed circuit.

A second co-pending U.S. application, Ser. No. 287,313, filed Aug. 8, 1994, entitled "Split-fixture Configuration and Method for Testing Circuit Traces on a Flexible Substrate," by James Edward Boyette, et al., having a common assignee with the present invention, the disclosure of which is hereby incorporated by reference, describes a fixture and method for testing circuit traces extending along a flexible substrate, which is fed in a longitudinal direction through the test fixture. In one station of the fixture, a lower surface of the flexible substrate extends against a backing plate, as the upper surface of the flexible substrate is exposed to an upper pair of movable probes, while in another station of the fixture, the upper surface of the flexible substrate extends against another backing plate, as the lower surface of the flexible substrate is exposed to a lower pair of movable probes.

BACKGROUND OF THE INVENTION

1. Field of the Invention

This invention relates to arranging randomly-listed sets of test points in a preferred sequence, and more particularly, to arranging sets of test points in a sequence minimizing the time required for test probes to travel among the sets of test points in the order of the sequence.

2. Background Information

The electronics industry has developed a number of products manufactured by processes including electrical testing to ensure product quality. In such products, a typical circuit board, or substrate, includes a number of conductive points or nodes exposed at one side of the board to a test process. In a properly made circuit board, certain of the test points are connected by electrical circuits, while other pairs of test points, forming parts of separate circuits, are not electrically connected.

A first part of the testing process involves checking for "opens," or open circuit conditions between various pairs of test points which are supposed to be electrically connected. For this testing, a pair of test probes is brought into simultaneous contact with the two test points, allowing a test circuit to determine electrical continuity. A second part of the testing process may involve checking for "shorts," or unwanted electrical connections between separate circuits. This type of testing can be performed using a two-probe method, in which a pair of test probes is brought into simultaneous contact with a test point on each of a pair of circuits which should not be electrically connected. If electrical continuity is detected, a short extends between the circuits.

The detection of short circuits can also be accomplished using a single probe, together with a conductive plane. The single probe is sequentially moved into contact with a number of test points on one side of the card. Each test point is electrically connected to a circuit, and the capacitance between the circuit and the ground plane is measured in the testing process. If a multi-level circuit board is being tested, a ground or voltage plane within the circuit board may be used to establish the conductive plane; otherwise the side of the board opposite the test points is laid on a flat conductive surface. The presence of a short circuit connecting two or more circuits is detected through an increase in the capacitance between these circuits and the conductive plane.

The circuit testing devices described in the co-pending applications cross-referenced above are examples of devices, performing this type of testing, which can benefit greatly from a method to order the sequence in which sets of test points are accessed to minimize the time needed to drive the probes between such sets of test points.

DESCRIPTION OF THE PRIOR ART

U.S. Pat. No. 5,023,557, to Moran, et al., describes a two-probe testing process in which the probes are moved between test points in a pattern that reduces movement distance without concern for ordering imposed by the nets themselves or by the tests being made. The approach afforded by the greedy algorithm approximation of the traveling salesman problem is used to reduce the total distance the two probes travel in making test measurements. With this approach, each next set of probe positions is chosen so that the required translation of probes involves the least movement from the previous probe position. Capacitance measurements may also be made using a single probe touching a single test point and an electrically conductive platform forming a ground plane while holding the device under test. Moran indicates that such a test may advantageously be included with two-probe resistance measurements in a sequence in which two probes are first brought into place at two test points on a circuit. After this test is completed, one of the probes is raised from the surface of the device being tested, so that a single-probe test can be applied by the other probe at the test point from which it has not been moved.

While Moran indicates a desire to optimize the performance of a circuit tester by minimizing the distance traveled by the probes between measurements, a number of practical types of circuit testers require a more sophisticated approach. For example, in many probe testers, each probe is mounted on a first stage, which is moved in a first direction (X or Y) along a second stage moved in a direction perpendicular to the first direction. Movement of the second stage includes movement of the first stage, which it carries. Thus, it is easier, and generally faster to move in the first direction. Furthermore, in many probe testing applications, one probe must be sometimes moved before another, or one probe must be moved in one direction before it can be moved in another direction, in order to prevent a collision between probes and between the stages moving with them. What is needed is a way to calculate weighted distances taking these problems associated with specific circuit testers into account, so that the optimization of probe movement sequencing can be more accurate. Furthermore, since a practical circuit test may involve checking dozens to hundreds of sets of points, which may in turn be arranged in tens of thousands to millions of sequences, a way is needed to limit the number of possibilities being considered as sets of points are linked together into sequences, while assuring that the best combinations of sets of points will be considered.

U.S. Pat. No. 5,138,266 to Stearns describes a single-probe testing technique in which the integrity of individual circuits on a circuit board is checked by measuring the capacitive coupling between each circuit and an adjacent electrically conductive plate. The single probe is brought into contact with a test point on each circuit to be tested in this way. However, Stearns does not address the need for a method to optimize the route taken by the single probe among the various test points.

SUMMARY OF THE INVENTION

In accordance with one aspect of the invention, there is provided a method for optimizing a sequence of test configurations within a circuit tester having structures which can be moved between various such test configurations. The method includes the steps of reading an input list of the test configurations and, for each test configuration within the input list, establishing each other test configuration an a next move candidate, calculating a weighted distance from the test configuration to the next move candidate, and storing an intermediate list having a maximum of a predetermined number of next move candidates. The weighted distance reflects a degree of difficulty in movement of the structures within the circuit tester from the test configuration to the next move candidate. The intermediate list includes the next move candidates with lowest weighted distances from the test configuration, and the predetermined number is less than the total number of test configurations in the input list. The method further includes the step of linking the test configurations into a chain, in a preferred order beginning with an initial test configuration, with each test configuration following the initial test configuration being chosen from available next move candidates within the intermediate list of a test configuration at the end of the chain. When one of the next move candidates is linked, it is removed form the available next move candidates. Until all the test configurations are linked, when next move candidates have been exhausted from the intermediate list of the test configuration at the end of the chain, an additional next move candidate is added to the intermediate list of the test configuration at the end of the chain.

Each test configuration describes the positions which a number of structures within the test fixture assume for the performance of an individual circuit test. In general, circuit test fixtures may include a number of different structures which must be moved from one position to another in a sequence. Such structures may include probes which are moved between positions before they are brought into contact with test points on a substrate being tested, masks which may be moved from one position to another, etc. Certain movable structures, such as the X- and Y-drive stages used to move a probe in a direction which is a resultant of orthogonal motions, are used to move another structure into position. The optimization method of the present invention considers in particular the way motion must occur to prevent a collision between such stages, as well as between the probes.

In the preferred embodiments to be discussed, these movable structures include one or more probes, which are independently moved along the surface of the substrate to be tested, and which are individually brought into contact with test points along one or more exposed surfaces of this substrate. In an embodiment having a single test probe, each test configuration includes a description of the location of the probe during a test procedure. In an embodiment having two or more test probes, each test configuration describes a set of points, in which each point indicates a location of each probe during a test procedure.

A general variable, described as a weighted distance, reflects the degree of difficulty in moving from one test configuration to another. While this degree of difficulty could reflect a number of conditions, such as mechanical wear which may occur when a certain structure is moved, in the preferred embodiments, the weighted distance is defined in a way that reflects the total time taken by probe movement. In this way, the optimization method operates to minimize this time. Generally, probe movement time is the most important variable to minimize, since it greatly effects the time request to complete the testing of the substrate. In this type of testing, the sequence in which tests occur does not effect the test results of the evaluation of data; all of the tests will be performed in the sequence determined by the optimization method, regardless of the results of individual tests.

BRIEF DESCRIPTION OF THE DRAWINGS

A preferred embodiment of the subject invention is hereafter described with specific reference being made to the following Figures, in which:

FIGS. 6 and 7 are fragmentary plan views of the fixture of FIG. 2, showing alternative positions for probes testing the substrate of FIG. 1;

FIG. 8 is an exploded isometric view of a first alternative fixture to which the algorithm of FIGS. 4 and 5 is applied;

DETAILED DESCRIPTION

Figure 1:
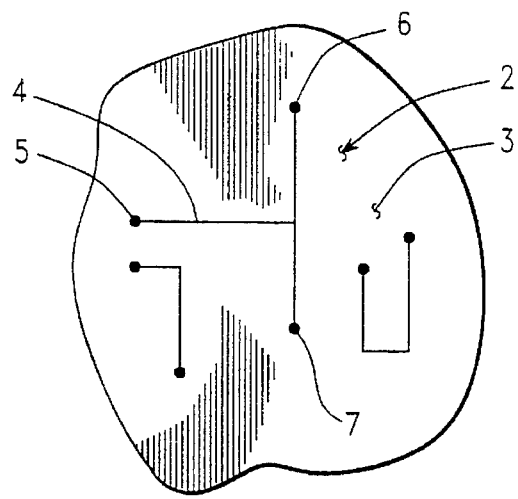
FIG. 1 is a fragmentary plan view of a substrate to be tested using the subject invention.

FIG. 1 is a fragmentary plan view of a substrate 2, such as a multi-chip module (MCM), showing a number of individual circuits to be tested. The substrate 2 may be fabricated, for example, from silicon wafer having a diameter of eight inches. Various individual circuits have two or more nodes at the accessible upper surface 3, serve as test points at which test probes may be placed during the testing process. The two-probe testing process checks the electrical characteristics of a circuit extending between two probes simultaneously contacting two test points on the circuit. For example, a circuit 4 may be tested by placing probes at points 5 and 6 for one test, at points 6 and 7 for another test, and at points 5 and 7 for yet another test. Since all tests within a predetermined pattern of tests are performed, the order in which the tests are performed on an individual circuit is not important, and the testing of one circuit does not have to be completed before tests are begun on another circuit.

Figure 2:
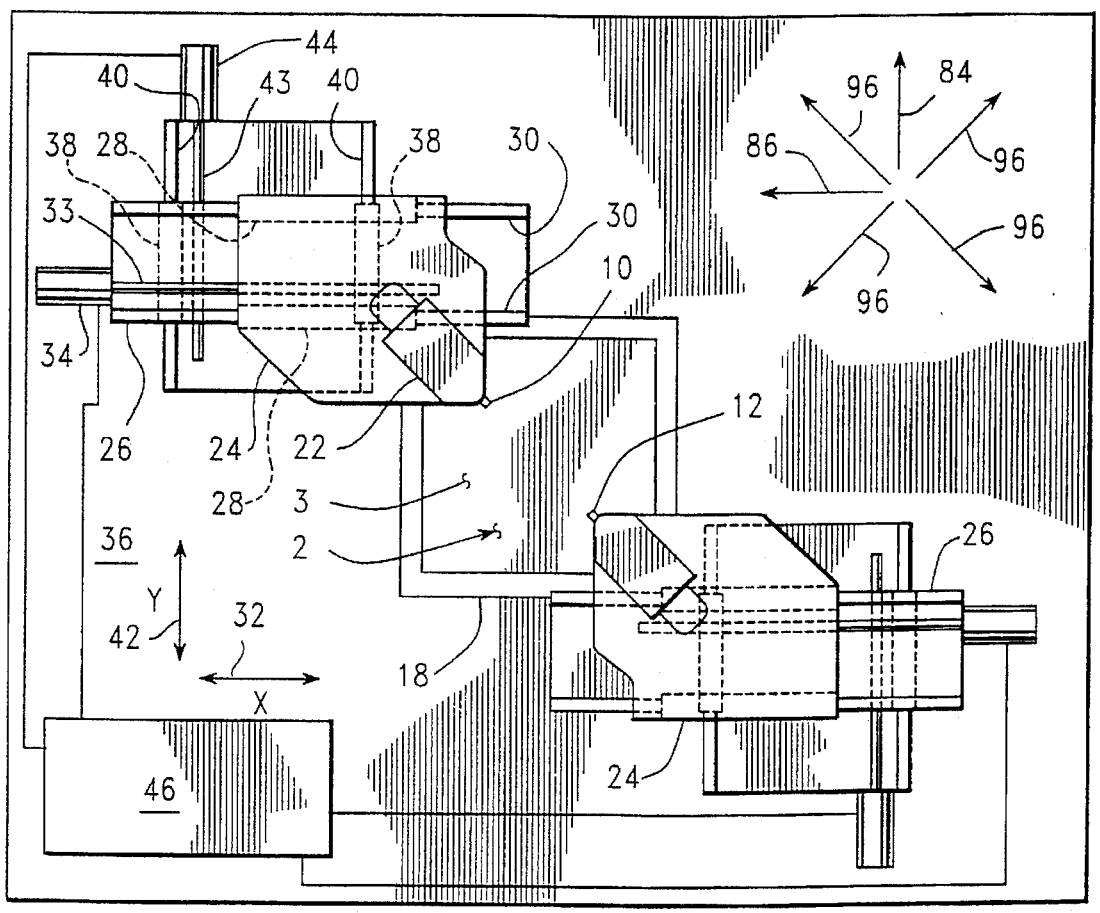
FIG. 2 is a plan view of a two-probe fixture used to test the substrate of FIG. 1, operating in accordance with the subject invention.

FIG. 2 is a plan view of a fixture used to test circuits within a substrate 2, such as an MCM (Multi-Chip Module). The various tests are performed as a first probe 10 and a second probe 12 are held in contact with the upwardly-exposed test surface 3 of a substrate 2 held in a substrate carrier 18. Each probe 10 and 12 is mounted on a probe carrier 22, which is provided with a Z-direction drive (not shown) moving the probe upward, out of contact with substrate surface 3, and downward, into contact with the surface 3. Each probe carrier 22 is mounted on an X-stage 24. Each X-stage 24 is mounted on an associated Y-stage 26, by means of bearings 28 operating on rails 30, to slide in the X-direction of arrow 32. This movement in the X-direction is caused by the rotation of a drivescrew 33 by X-drive motor 34. In turn, each Y-stage 26 is mounted on the fixture structure 36, by means of bearings 38 operating on rails 40, to slide in the Y-direction of arrow 42. This movement in the Y-direction is caused by the rotation of another drivescrew 43 by Y-drive motor 44. The movement of drive motors is controlled by an electronic controller 46, which is preferably an appropriately programmed digital computer. Various conventional means (not shown), such as optical encoders, are used to track the movements of X-stages 24 and Y-stages 26.

The test processes required for a single substrate 2, such as a multi-chip module, typically involve thousands of measurements, with the movement of one or both test probes being required between individual measurements. A significant portion of the time required for completion of the test process elapses during the movement of probes between individual tests. To reduce the time required for such probe movement, in accordance with the present invention, the sequence of paths along which the probes are moved among test points are determined through the use of an optimization algorithm. If electronic controller 46 is a digital computer, the optimization algorithm may be applied within the controller 46. Alternately, the optimization algorithm may be applied within a separate digital computer (not shown), with the resulting data being supplied to the controller through the use of removable media, such as a magnetic disk, or through a communication cable connecting the separate digital computer with controller 46.

In general, the Optimization Algorithm attempts to minimize the accumulated time required to move both probes among the various test points in completing all of the tests required for a particular circuit board or device. In doing this, the Optimization Algorithm takes into consideration a number of factors based on the manner in which the X-stages 24 and Y-stages 26 are moved. For example, since each X-stage 24 is physically mounted on an associated Y-stage 26, the movement of either probe in the Y-direction of arrow 42 requires the movement of both an X-stage 24 and a Y-stage 26. Since the mass which must be moved to accomplish probe movement in the Y-direction is substantially larger than the mass which must be moved to accomplish probe movement in the X-direction of arrow 32, probe movement in the X-direction occurs more rapidly and is preferred over movement in the Y-direction. To take this difference into account in the calculations associated with the Optimization Algorithm, weighting factors are applied to the distances the probes must travel in the X- and Y-directions.

On the other hand, a distinction is not made between the two opposite directions of travel in the X-direction indicated by arrow 32, or between the two directions of travel in the Y-direction indicated by arrow 42. The leadscrew drive mechanisms do not move X-stages 24 and Y-stages 26 more rapidly on one direction than in the opposite direction.

If, for example, the first probe 10 has to move through the space currently occupied by the second probe 12, the second probe must move before the first probe, in a process called sequencing. If sequencing occurs, the actual travel is the sum of the maximum the X- or Y-motion from the first probe movement and the maximum X- or Y-motion from the second probe movement.

Figure 3:
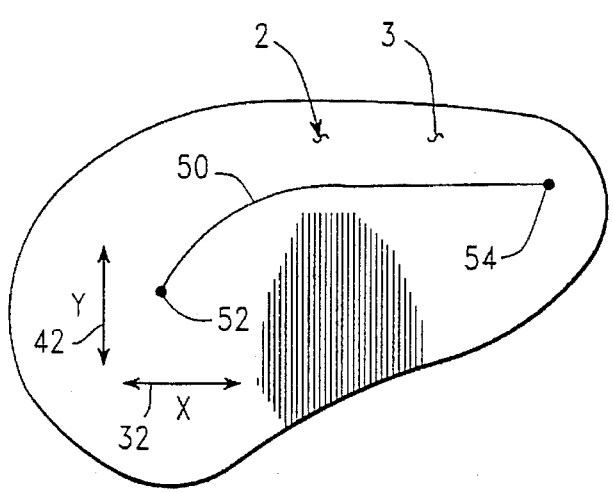
FIG. 3 is a schematic plan view showing the path of a probe in the fixture of FIG. 2 during the process of testing the substrate of FIG. 1.

FIG. 3 shows a typical path 50 of probe movement between an initial point 52 and a next point 54 adjacent to test surface 3 of substrate 2, along with an arrows 32 and 42 indicating, respectively, the X- and Y-directions previously described in reference to FIG. 2. Since the distance travelled in the X-direction of arrow 32 is substantially longer than the distance travelled in the Y-direction of arrow 42, in this example, the time required for this movement is dependent only on the distance between these points in the X-direction. When probe movement can occur simultaneously in both the X- and Y-directions, the time required for such movement is generally dependent only on the distance moved in either the X- or Y-direction.

To minimize the time required for probe movement during the process of testing a circuit card or other device, the sum or individual maximum axis movements, in the X- or Y-directions, must be minimized, taking into account various factors, such as the movement speeds achieved in these directions and sequencing requirements. This is accomplished using a multi-segment prober Optimization Algorithm.

Data input to this algorithm is provided in the form of a list of sets of test points determined according to the circuit patterns of the circuit board or other device being tested.

Each set of test points forms a line in the list, defining a pair of test points between which an electrical measurement is to be made. Thus, this list is based on the particular electrical measurements to be made and on the physical characteristics of the device being tested, such as the location of test points. This list is provided in the form of a Test Point Data Structure (TP), each entry of which has the following format:

TP[i]XFrom, TP[i]YFrom, TP[i]XTo, TP[i]YTo

This nomenclature is based on the concept that an electrical measurement is to be made from one point, at which first probe 10 (shown in FIG. 2) is placed, to another point, at which second probe 12 (also shown in FIG. 2) is placed. Thus, for the line of the Test Point Data Structure, the X- and Y-coordinates of the position of the first probe are given by TP[i]XFrom and TP[i]YFrom, respectively. Similarly, the X- and Y-coordinates of the position of the second probe are given by TP[i]XTo and TP[i]YTo, respectively. The order of the lines in this input list is unimportant, since the Optimization Algorithm is provided to organize them. Thus, the data output from this algorithm is in the form of a list of the same sets of test points, ordered in such a way that the movement of test probes in the sequence of the list results in optimum usage of the prober test fixture.

Figures 4, 4A:
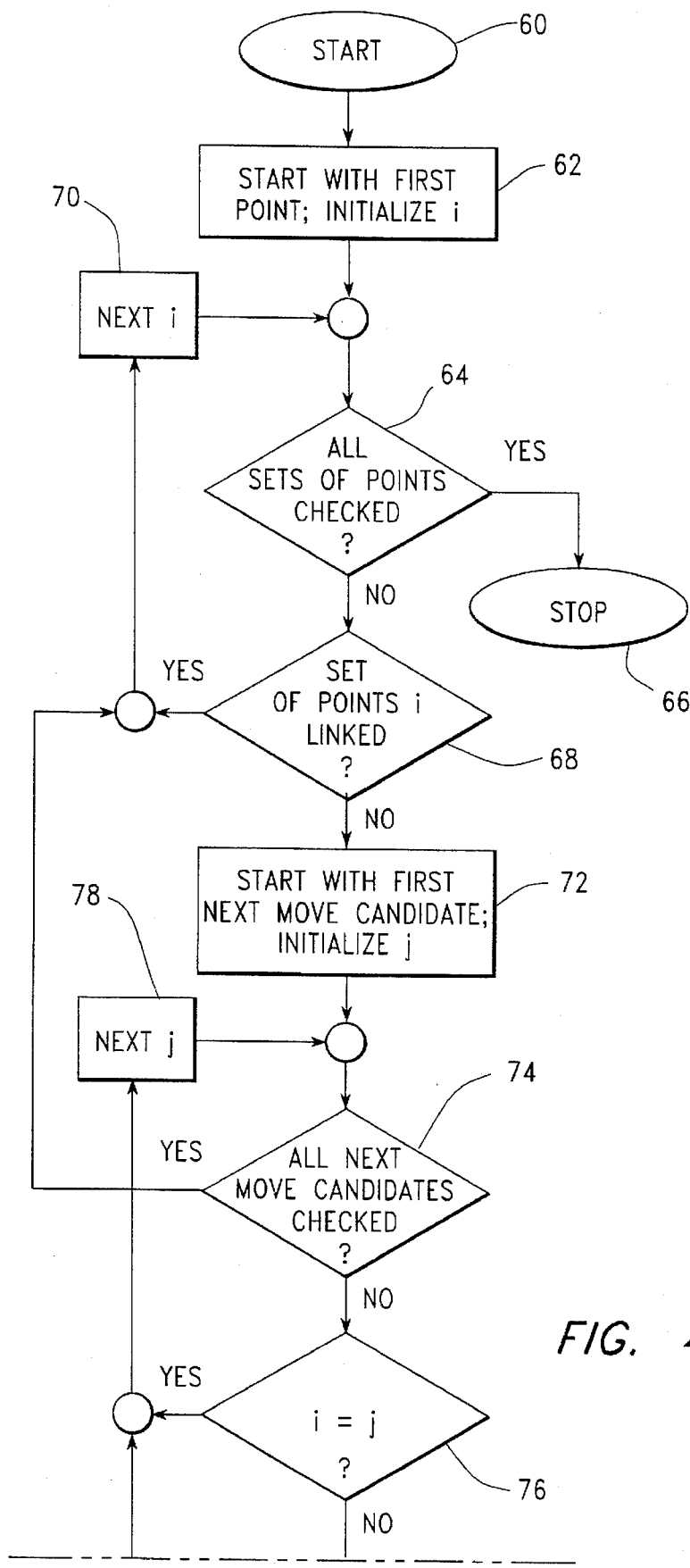
FIGS. 4, 4A–C are flow diagrams showing operation of a First Pass of an algorithm used to optimize probe movement in the fixture of FIG. 2.
Figure 4B:
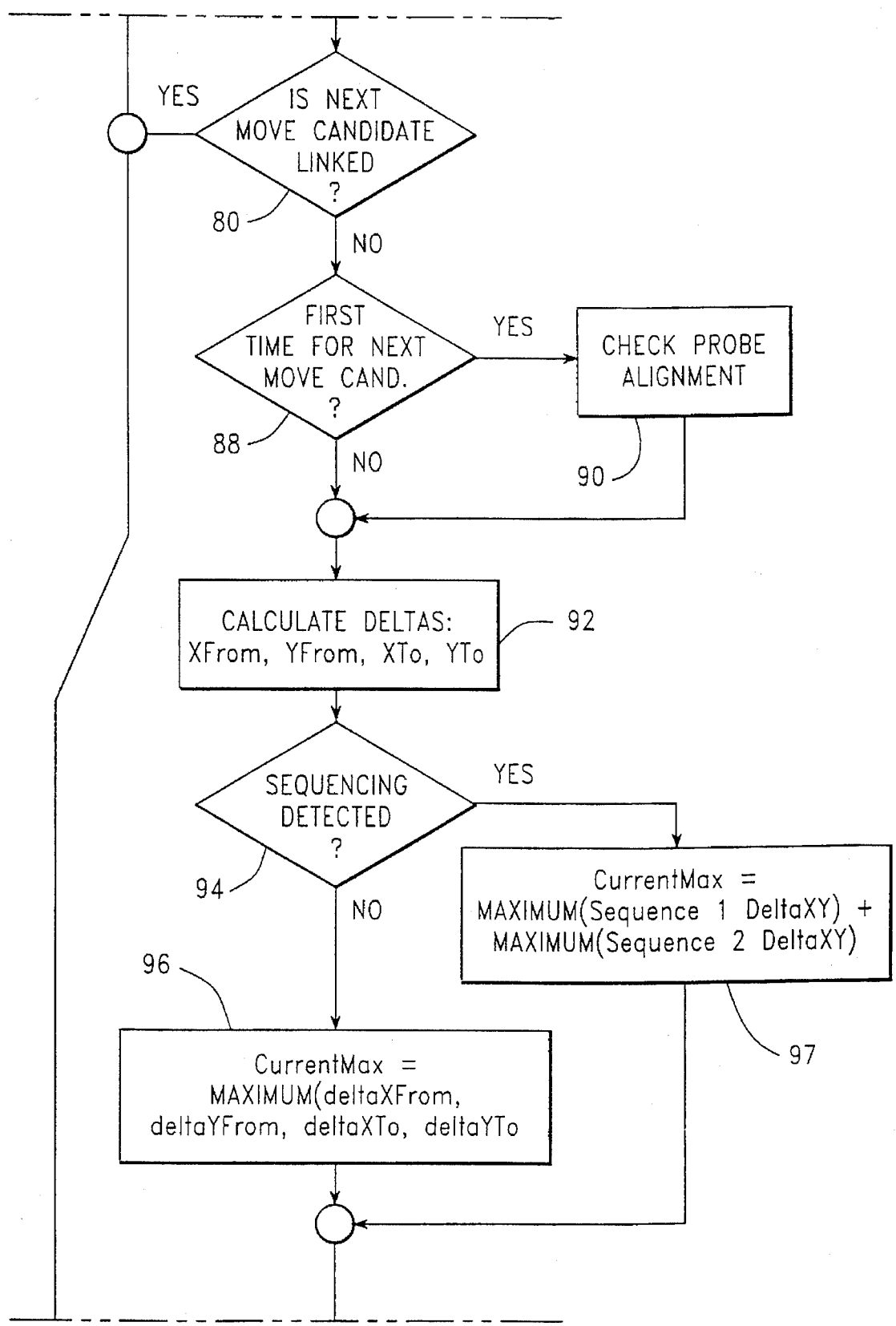
Figure 4C:
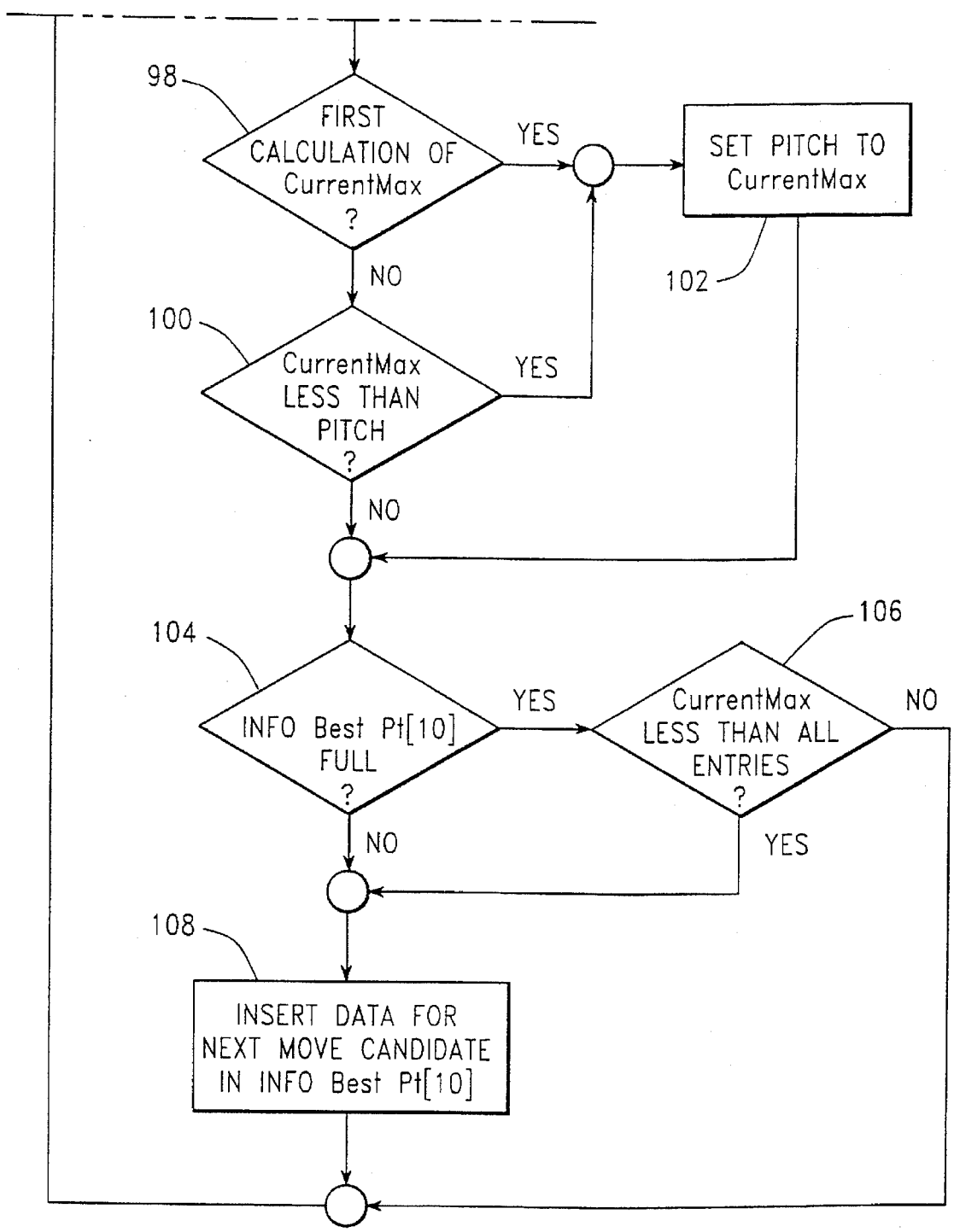

FIG. 4 is a flow chart showing the operation of a First Pass of the Optimization Algorithm. In this first pass, a predetermined number of the shortest next move candidates is listed for each set of points. For example, closest ten next move candidates may be listed. The limitation of the number of next move candidates to be considered at a time greatly reduces the memory required to run the Optimization Algorithm.

Within the First Pass, a weighted maximum distance is calculated for movement between each set of points and various other sets of points. (The phrase "set of points" is understood to mean the corresponding points at which the first and second probes are held during a measurement, as defined in a single line of the Test Point Data Structure described above. Similarly, the phrase "next move candidate" is understood to mean another set of corresponding points at which the first and second probes are held during another measurement, as defined by another line of the Test Point Data Structure.) Weighting factors include considerations made for differences in the speeds of X- and Y-direction movement, and consideration of the additional movement needed for sequencing, when it is required to prevent mechanical interference between the first and second probes.

TABLE 1 is a pseudo code listing of an implementation of the First Pass of the Optimization Algorithm. A Test Point Data Structure (TP) provides the input information needed by the Algorithm. A Test Point Information Structure (TPI) holds information generated by the program. For each set of points, the TPI includes an intermediate table, INFO BestPt [10] which lists, for example, the ten best candidates for the next move. The number of points to be listed in each intermediate table depends on a number of factors, such as the number of points to be tested and the size of memory available for storing data. In general, since a practical test circuit includes hundreds of points to be tested, this use of intermediate tables provides an advantage of requiring much less memory, and reduced processing time, for execution of the Algorithm. In this way, an advantage is gained over the prior art, as described particularly in U.S. Pat. No. 5,023,557 to Moran et al.

When a set of points is linked with a previous set of points, in a manner which will be explained with reference to FIG. 5, the "Prev" variable provides an index to the previous set of points. Similarly, when a set of points is linked with a following set of points, the "Next" variable provides an index to the next set of points.

TABLE 1

FIRST PASS OF Optimization Algorithm

```
Test Point Data Structure (TP)
    float XFrom, YFrom, XTo, Yto      /*Probe 1 = From(x,y) Probe 2 = To(x,y)      */
Information Structure (INFO)
    long In                            /*index of test point                         */
    float MM                           /*Min(Max (delta X delta Y))                  */
Test Point Info Structure (TPI)
    INFO BestPt[10]                    /*info for ten best candidates for next move  */
    long Next                          /*index of next test record                   */
    long Prev                          /*index of Previous test record               */
    TPI BestPtAr[]                     /*pointer to array of best candidates for each test
    **point
                                       */
float "Pitch"                          /*"Pitch" will be smallest distance between pts  */
/*allocate storage for an array of Test Point Info Structures
**must be able to get (Number of Test Points*Size of TPI) bytes of storage
*/
BestPtAr = Allocate (NumberOfTestPoints*SIZE OF(TPI))
FOR (Every Test Point)                 /*i is this loop reference*/
    IF (Point not linked)              /*don't find best points if already linked up*/
        FOR (Every Test Point)         /*j is this loop reference*/
            IF (i NOT = j) AND (Point j is not linked to another point)
            */
                **Make sure the probes are oriented properly . . . such as, probe 1
                **to upper left of probe 2
                */
                IF (First pass)
                    CheckProbeAlignment
```

TABLE 1-continued

FIRST PASS OF Optimization Algorithm

```
        */
        **Calculate Deltas - NOTE: a weighting factor is applied since the X
        **probe stage actually travels with a greater velocity
        */
        deltaXFrom = X_WEIGHTING x (TP[i]XFrom - TP[j]XFrom)
        deltaYFrom = Y_WEIGHTING x (TP[i]YFrom - TP[j]YFrom)
        deltaXTo = X_WEIGHTING x (TP[i]XTo - TP[j]XTo)
        deltaYTo = Y_WEIGHTING x (TP[i]YTo - TP[j]YTo)
        /*
        **If probe 1 has to move through the space where probe 2 currently
        **resides then probe 2 must move prior to probe 1, this is called
        **sequencing. If sequencing occurs then the actual travel is the
        **sum of the maximum X/Y delta from the first sequence and the
        **maximum X/Y delta from the second sequence
        */
        IF (Sequencing detected)
            "CurrentMax" = MAXIMUM(Sequence 1 DeltaXY) + MAXIMUM
            (Sequence 2 DeltaXY)
        ELSE
            "CurrentMax" = MAXIMUM(deltaXFrom, deltaYFrom, deltaXTo,
            DeltaYTo)
            /*
        **Also check the current max and see if it is less than the current "Pitch"
        **value . . . if so then save the current max as the new "Pitch" value ALSO
        **save if the first time through
        */
        IF ("CurrentMax" < "Pitch") OR (First pass)
            Save Current Max as "Pitch"
        ENDIF
     ENDFOR
  ENDIF
ENDFOR
```

Figures 5, 5A:
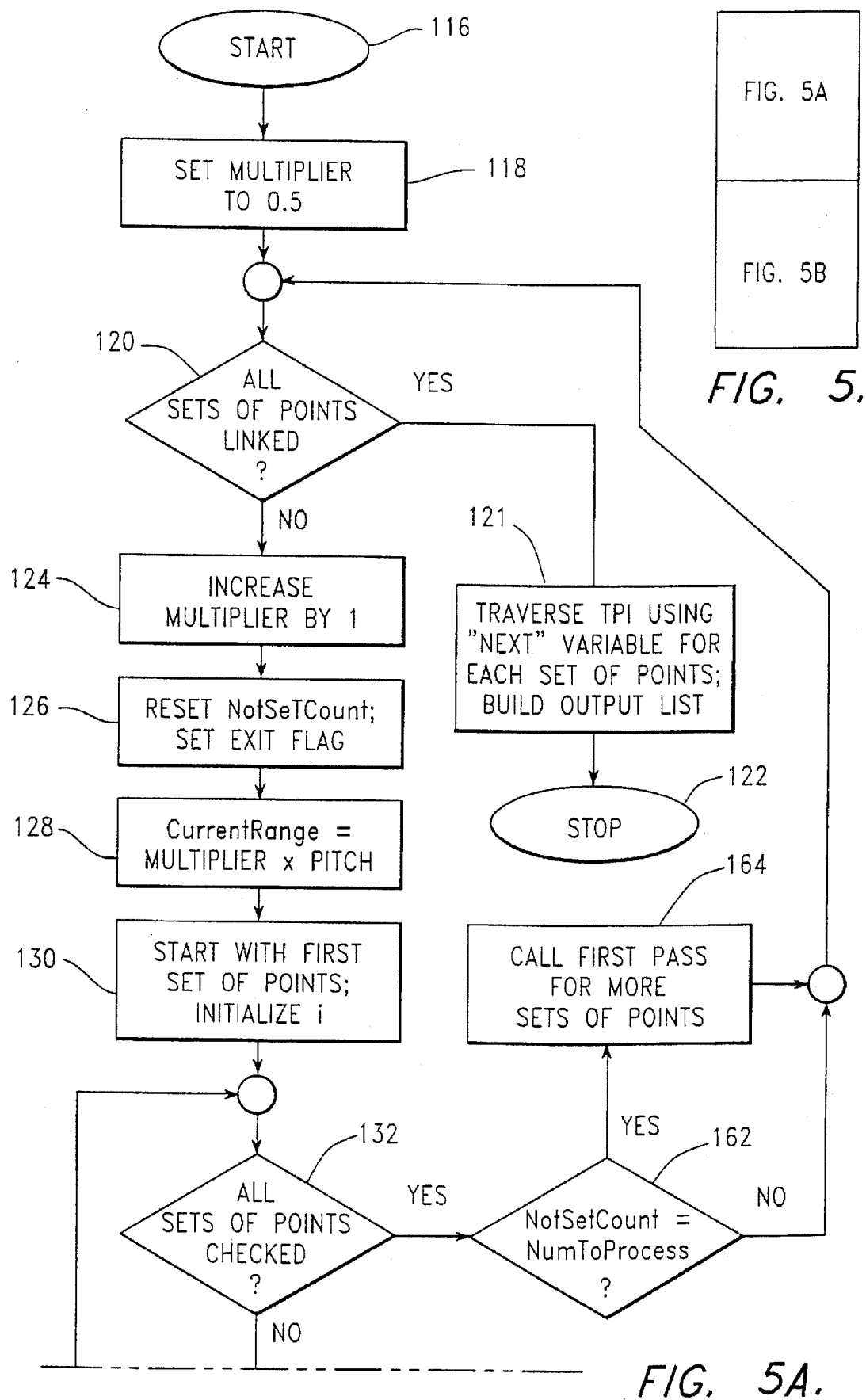
FIGS. 5, 5A, 5B are flow diagrams showing operation of a Second Pass of the algorithm used to optimize probe movement in the fixture of FIG. 2.
Figure 5B:
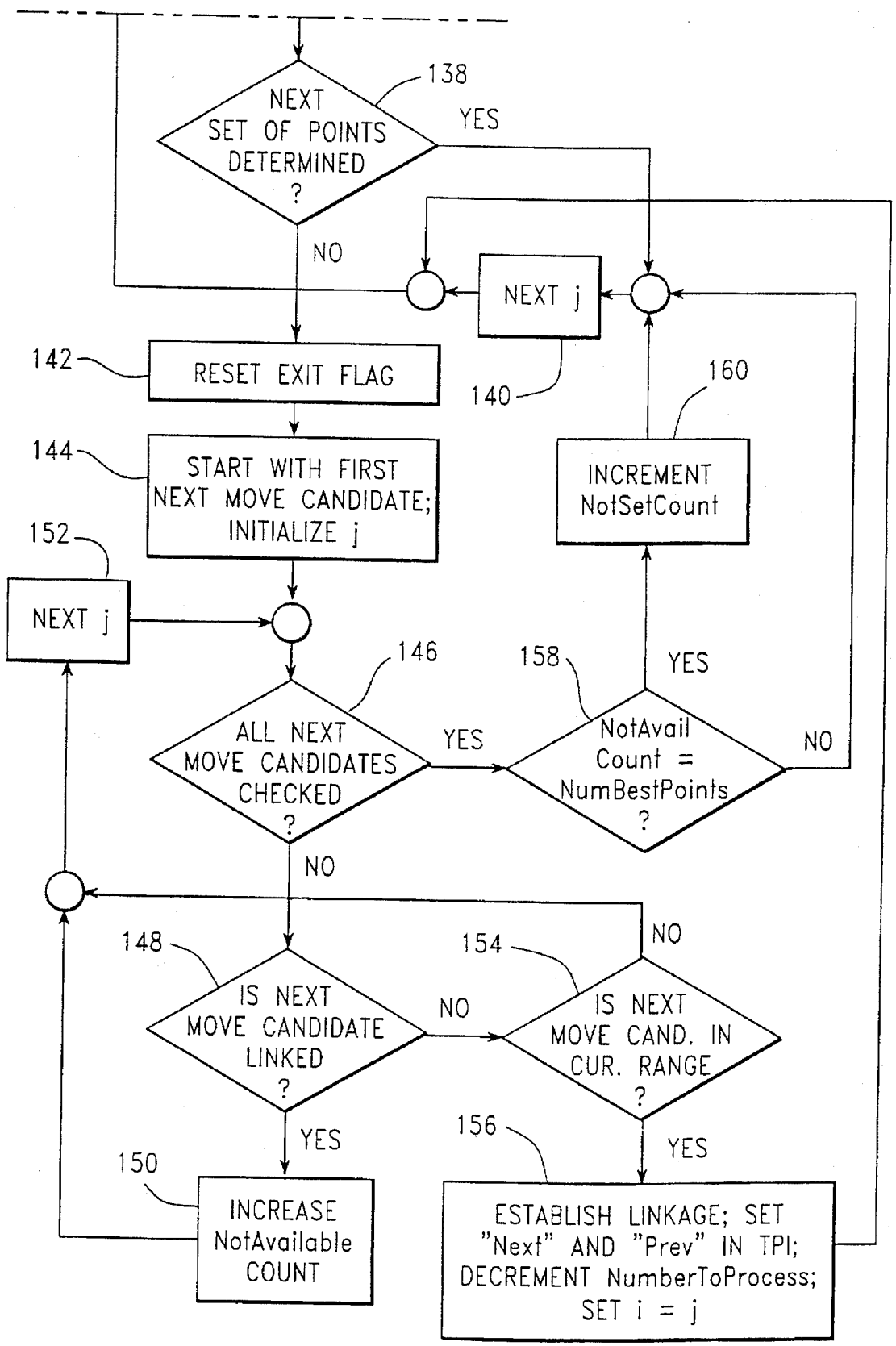

FIG. 5 is a flow chart showing the operation of a Second Pass of the Optimization Algorithm, which begins with the specification of an initial set of points, to which the closest other set of points is linked. The initial set of points is then eliminated from the available sets of points, and the second set of test points becomes the set of test points, to which a new closest available set of points is linked. When a set of points is linked, it is eliminated from availability as a next move candidate. These activities are continued until all of the test points have been used, indicating completion of the selection process of the algorithm, or until a set of test points having no remaining next move candidates left in its list is chosen by the algorithm, indicating a need to return to the First Pass of the algorithm to develop a list of new sets of test points.

TABLE 2 is a pseudo code listing of an implementation of the Second Pass of the Optimization Algorithm.

TABLE 2

SECOND PASS OF Optimization Algorithm

```
float "Pitch"                          /*"Pitch" will be smallest distance between pts    */
float Multiplier = 0.5                 /*multiplier used with "Pitch"                     */
DO UNTIL (All Points Linked)
    Increase Multiplier by 1
    Reset NotSetCount                  /*Indicates points remaining                       */
    Set Exit Flag                      /*assume we will exit this time                    */
    Set "CurrentRange" to Multiplier x "Pitch"
    FOR (Every Test Point)             /*i is this loop reference                         */
        IF (The set of points following this point set of points have not been
        determined)
            Reset Exit flag            /*still found one . . . don't exit yet             */
            FOR (Number of Best Points)    /*j is this loop reference                     */
                IF(BestPtAr[i].BestPt[j] is available)    /*check jth best point           */
                    IF (this point is within CurrentRange)
                        IF (it is available)
                            Establish jth best set of points as set of points to test
                            after this one (i)
                            Indicate this point has been used
                            Decrement NumberToProcess
                        ELSE
                            Indicate jth best set of points not available
                    ELSE
                        Go to next set of points (Best sets of points ordered with
```

TABLE 2-continued

SECOND PASS OF Optimization Algorithm

```
                    smallest distance first.)
            ELSE
                Increase NotAvailable Count
        ENDFOR
        IF (NotAvailable Count = Number of Best Sets of Points)
            Increment NotSetCount
    ENDIF
    ENDFOR
    /*
    **All unlinked points have NO best points remaining . . . get new selection
    **of best points and continue processing the remaining points
    */
    IF (NotSetCount = NumberToProcess)
        Call First Pass to find more best sets of points
ENDDO
```

Referring to FIG. 4, the First Pass is begun at step 60. In step 62, the initial set of points is chosen, with the first loop reference i being set to an initial level. In step 64, a determination is made of whether all sets of points i have been checked by this process. This determination is necessary because this part of the process is part of a loop used until all sets of points i have been checked. If they have, the First Pass is completed, so this process is stopped in step 66; otherwise this process is continued, to determine, in step 68, if the set of points i has been linked to other sets of points. This determination is necessary because the First Pass may be used, as described above, to provide additional sets of points as needed in the Second Pass, after various of the sets of points have been linked. To determine whether a set of points has been linked, the "Prev" and "Next" variables of the Test Point Info Structure (TPI) for the set of points are checked. If it is determined that the set of points i has been linked, this set of points is not available for further consideration, so the first loop reference i is incremented in step 70. Following step 70, the determinations of steps 64 and 68 are repeated for the new set of points.

If a determination is made in step 68 that a set of points is not linked, the process continues to determine the weighted distances between the set of points i and various other sets of points considered as next move candidates, which are identified by a second loop reference j. In step 72, j is initialized to start with the first next move candidate. In step 74, a determination is made of whether all next move candidates have been checked for distance from the set of points i. If they have, then this portion of the process is complete, so the first loop counter i is incremented in step 70. If they have not all been checked, this portion of the process continues, with a determination being made in step 76 of whether i equals j. Since there is no need to determine the distance of a set of points from itself, if these loop counters are equal the second loop counter is incremented in step 78, and the process is returned to step 74. If it is determined in block 76 that i and j are not equal, a determination is made in step 80 of whether the next move candidate j has been linked by checking the "Prev" and "Next" variables for next move candidate j in the TPI structure. If this next move candidate has been linked, it is not available, so second loop reference j is incremented in step 78.

FIGS. 6 and 7 are fragmentary plan views of the fixture described above in reference to FIG. 2, showing alternative positions which may be taken by the probes during the circuit testing process. Thus, FIGS. 2, 6, and 7 show the probe alignments which are allowable for the test device of FIG. 2. Referring first to FIG. 2, regardless of the position of the probes 10 and 12, the X-stage 24 and Y-stage 26 of probe 10 extend to the left, in the direction of arrow 84, and to the rear of the fixture, in the direction of arrow 86. Thus, as in the example of in FIG. 2, if one test point is to the left and to the rear of the other test point, the first probe 10 must be used to contact the test point to the left and rear, while the second probe 12 contacts the other test point. In the example of FIGS. 6 and 7, if one of the test points is to the left and to the front of the other, either first probe 10 or second probe 12 can be used to contact either test point, while the other probe contacts the other test point. Therefore, as the First Pass of the algorithm is performed for the first time, each set of points is checked to assure that the data represents a valid probe alignment. If it does not, the assignments of the two probes may be switched between the test points in the set of points.

Thus, referring again to FIG. 4, if a set of points has not been linked as determined in step 80, a determination is made in step 88 of whether the process is examining next move candidates for the first time. If it is, the probe alignment of the next move candidate is checked in step 90. If the probe alignment is as shown in FIG. 2, 6, or 7, the system proceeds; otherwise, a change must be made, such as switching the "From" and "To" designations. Making this determination at this point allows problems to be discovered as the first set of next move candidates is examined, before additional processing has occurred.

From this point, a number of steps are performed to calculate the weighted distance between the set of points i and the next move candidate j. First, in step 92, weighted distances, or "deltas," are calculated to reflect the degree of difficulty of probe movement in the test fixture. Weighting factors may be applied if movement is faster in one direction than in the other direction, or optimize other conditions, such as mechanical wear occurring in the test fixture. In the example of the test fixture of FIG. 2, weighting factors are applied to compensate for the fact that movement in the X-direction can occur more rapidly than movement over a similar distance in the Y-direction. These weighted distances are calculated according to the following equations:

$$\text{deltaXFrom} = \text{X\_WEIGHTING} \times (\text{TP}[i]\text{XFrom} - \text{TP}[j]\text{XFrom}) \quad 1)$$

$$\text{deltaYFrom} = \text{Y\_WEIGHTING} \times (\text{TP}[i]\text{YFrom} - \text{TP}[j]\text{YFrom}) \quad 2)$$

$$\text{deltaXTo} = \text{X\_WEIGHTING} \times (\text{TP}[i]\text{XTo} - \text{TP}[j]\text{XTo}) \quad 3)$$

$$\text{deltaYTo} = \text{Y\_WEIGHTING} \times (\text{TP}[i]\text{YTo} - \text{TP}[j]\text{YTo}) \quad 4)$$

The Y_WEIGHTING factor is greater than the X_WEIGHTING factor to compensate for this difference in directional velocities. The weighted distance moved by first probe 10 (shown in FIG. 2) is given by equation 1) in the X-direction and by equation 2) in the Y-direction. The weighted distance moved by second probe 12 (also shown in FIG. 2) is given by equation 3) in the X-direction and by equation 4) in the Y-direction.

Sequencing is needed whenever one of the probes must be moved before moving the other, or when one probe must be moved in a particular direction before moving in the other direction to get to a new test point, in order to prevent a collision between the probes. Thus, in step 94, a determination of whether sequencing is required is made by proceeding through a series of expressions relating the coordinates of the probe positions before and after the probes are moved. Variables are defined to indicate coordinates are defined as follows:

p1i.x Position of first probe in x-direction before the move.
p1i.y Position of first probe in y-direction before the move.
p2i.x Position of second probe in x-direction before the move.
p2i.y Position of second probe in y-direction before the move.
p1f.x Position of first probe in x-direction after the move.
p1f.y Position of first probe in y-direction after the move.
p2f.x Position of second probe in x-direction after the move.
p2f.y Position of second probe in y-direction after the move.

Table 3 lists code used in the determination of whether sequencing is needed and of which probe should be moved first in which direction. These relative values of these variables are used to determine an offset, indicated as the variable "code" into a table of numbers indicating which probe should be moved first in which direction.

TABLE 3

SUBROUTINE FOR DETERMINING SEQUENCING

```
intGetSequence(MEASUREMENTS*M1, MEASUREMENTS*M2
{
XYPROD p1i, p1f, p2i, p2f:            //local MYPROD values
    init code = 0;                    //Movement code - 64 combinations
    /*Initialize local variables*/
    p1i.x=M1->XFrom;
    p1i.y=M1->YFrom;
    p2i.x=M1->XTo;
    p2i.y=M1->YTo;
    p1f.x=M2->XFrom;
    p1f.y=M2->YFrom;
    p2f.x=M2->XTo;
    p2f.Y=M2->YTo;
    if(p1f.x>p1i.x)
    {
        if(p1f.x>p1i.y) code|050 code;    /*code=05?        */
        else if(p1f.y<p1i.y code|=060;    /*code=06?        */
        else                              /*code|=07?       */
            code|=070;                    /*p1f.y==p1i.y   */
    }
    if(p1f.x<P1i.x)
    {
        if(p1f.y>p1i.y) code|020;         /*code=02?        */
        else if(p1f.y<p1i.y code|=010;    /*code=01?        */
        else                              /*code=03?        */
            code|=030;                    /*p1.y==p1i.y    */
    }
    else                                  /*p1f.x==p1i.x   */
    {
    if(p1f.y<p1i.y) code|=040;            /*code=04?        */
        else                              /*code=00?        */
            code+e,cir +ee =code;         /*p1f.y<=p1i.y   */
    }
    if(p2f.x>p2i.x)
    {
        if(p2f.y>p2i.y) code|=005;        /*code=0?5        */
        else if(p2f.y<p2i.y code|=006;    /*code=0?6        */
        else                              /*code=0?7        */
            code|=007;                    /*p2f.y==p1i.y   */
    }
    else if(p2f.x<p2i.x)
    {
        if(p2f.y>p2i.y) code|002;         /*code=0?2        */
        else if(p2f.y<p2i.y code|=001;    /*code=0?1        */
        else                              /*code=0?3        */
            code|=003;                    /*p2f.y==p2i.y   */
    }
    else                                  /*p2f.x==p2i.x   */
    {
        if(p2f.y>p2i.y) code|=004;        /*code=0?4        */
        else                              /*code=0?0*/
            code|=code;                   /*p2f.y<=p2i.y*/
    }
    if(sequence[code]==0) return(sequence[code]);
    return(sequence[code]|SEQ_BIT);
}                                         /*end GetSequence */
```

In the first portion of the routine of TABLE 3, the second digit of the code variable is determined, while in the second portion of this routine, the third digit of this variable is determined. There are 64 entries in the table used to determine which probe is moved in which direction. Each of these entries corresponds to a unique value of the variable "code."

Referring to FIG. 3, either the first probe 10 or the second probe 12 can be moved to in any of four directions by operating a single drive motor 34 or 44—to the rear of the test fixture (in the direction of arrow 86), to the front of the test fixture (opposite the direction of arrow 86, to the left (in the direction of arrow 84), or to the right, (opposite the direction of arrow 84). By operating both a drive motor 34 and a drive motor 44, either of the probes may also be moved in one of the four diagonal directions indicated by arrows 96. Various individual entries found using the variable "code" are used to indicate that each probe should be moved in each of these eight different directions. A value of zero returned from this table indicates that sequencing is not needed; the two probes can be moved in the most efficient way to the next set of test points.

Referring again to FIG. 4, if sequencing is not needed, the current maximum weighted distance, assigned to a variable named "CurrentMax," is calculated in step 96 to be the maximum absolute value of the four values derived from equations 1) through 4). That is, the current maximum is given by the following equation::

$$\text{"CurrentMax"} = \text{MAXIMUM}(\text{deltaXFrom, deltaYFrom, deltaXTo, deltaYTo}) \quad 5)$$

The absolute value is used because the direction of travel (i.e. right or left) along the X- or Y-axis does not matter. On the other hand, if sequencing is needed, the current maximum weighted distance is calculated in step 97 according to the following equation:

$$\text{"CurrentMax"} = \text{MAXIMUM}(\text{Sequence 1 DeltaXY}) + \text{MAXIMUM}(\text{Sequence 2 DeltaXY}) \quad 6)$$

This equation reflects the fact that, in a movement for which a need for sequencing is detected, one probe movement (Sequence 1) must occur before the other probe movement (Sequence 2) can begin. Sequence 1 may be the movement of one probe, out of the way, before the other probe is moved. Sequence 1 may alternately be the movement of a probe in a preferred direction before it is moved in another direction. The first term of this equation, MAXIMUM (Sequence 1 DeltaXY), is a weighted maximum representing the distance of the first move. The second term of this equation, MAXIMUM(Sequence 2 DeltaXY), is a weighted maximum representing the distance of the second move. These terms are added because the movements must occur in sequence. Thus, the variable "CurrentMax" represents the weighted maximum distance required for movement between set of points i and next move candidate j.

Thus, the Optimization Algorithm includes routines which are customized for a particular circuit test device, such as the test fixture described above in reference to FIG. 2. The weighted distance "CurrentMax" is calculated to reflect a degree of difficulty in moving the probes from a set of points to a next move candidate, because of a need to move in one direction instead of another, or because of a need to move in a particular sequence to avoid collisions between the probes and their associated stages. These features provide particular advantages over the prior art, as described particularly in U.S. Pat. No. 5,023,557 to Moran et al.

A variable named "Pitch" is developed to indicate the shortest weighted distance between sets of points and next move candidates as determined by the process described above. This variable is used, in a manner which will be described, in the Second Pass of the Optimization Algorithm to determine which sets of points are of interest for consideration as the next set of points to be linked with a given set of points. Since "Pitch" is set according to the minimum move distance, the "Pitch" value is saved the first time the "CurrentMax" variable is calculated, to begin the process of determining a "Pitch" value, and otherwise whenever the value of "CurrentMax" is less that the value of "Pitch". Thus, determinations are made in steps 98 and 100 of whether "CurrentMax" has been calculated for the first time, and whether "CurrentMax" is less than the value currently stored for "Pitch". If either of these is true, "Pitch" is set equal to "CurrentMax" in step 102.

Next, a determination is made of whether the set of points j, for which these calculations have been made, should be placed in the array of best next move candidates for the set of test points i. If the intermediate table INFO BestPt[10] is not full, as determined in step 104, or if the "CurrentMax" is less than each of the entries in this intermediate table, as determined in step 106, data for the next move candidate j is placed in the intermediate table for set of points i in step 108.

To simplify operations with each intermediate table INFO BestPt[10], data in such a table is arranged in order of increasing levels of the weighted distance, developed as "CurrentMax," for each table entry. That is, the first entry in the table represents the next move candidate j having the lowest weighted distance from the set of points i, the second entry represents the set of points j having the second lowest such weighted distance, and so on. If the table is full, and if the value of "CurrentMax" is larger than any of the weighted distance values stored in the table, the present set of points j is not stored in the table. If the table is full, and if the value of "CurrentMax" is smaller than one or more of the points in the table, the current next move candidate j is inserted into the table in a way that retains or restores the ascending order of weighted distances within the table, and the next move candidate listed last in the table is discarded from the table.

At this point, the calculations relative to movement of the probes from set of points i to next move candidate j have been completed, so the level of j is incremented in block 78 to repeat the operation for a new next move candidate j. If all sets of points j for the current value of i have been checked, as determined in step 74, the value of i is incremented in step 70. If all sets of points i have been checked, as determined in step 64, the First Pass of the Optimization Algorithm is completed, so this part of the process is stopped in step 66.

Referring to FIG. 5, sets of points are linked in the Second Pass of the Optimization Algorithm, which starts with step 116. This part of the process is begun as soon as the First Pass, described above in reference to FIG. 4, is completed.

The "Multiplier," which is used, together with the value of "Pitch" set in step 102 of the First Pass (shown in FIG. 4), to determine the range of weighted move distances of new sets of points to check. In step 118, the "Multiplier" is set to an initial value of 0.5. Next, in step 120, a determination is made of whether all sets of points have been linked. If they have, the process of linking sets of points is completed, so an output table is created in step 121 and the program is ended in step 122. The determination of step 120 is necessary at this point in the process because this portion of the process is part of a loop which is used repeatedly until all sets of points have been linked. If all sets of points have not yet been linked, the "Multiplier" is increased by a value of one in step 124. Thus, in the first pass through this loop, the "Multiplier" has a value of 1.5; on the second pass, the multiplier is increased to 2.5, etc. Next, in step 126, the variable NotSetCount is reset, indicating that there are sets of points remaining to be linked, and the Exit flag is set, indicating that the process will exit this loop at this time. If the process does not exit this loop, the Exit flag will be reset in a later step. Next, in step 128, the variable "CurrentRange" is determined as the "Pitch" is multiplied by the "Multiplier."

From this point, attempts will be made to find an optimum matches between sets of points i and next move candidates j, which will result in the next move candidate j directly following the set of points i in the ordered listing provided as output from the Optimization Algorithm. In step 130, the first loop reference i is initialized to begin with the first set of points i. Next, in step 132, a determination is made of whether all available sets of points i have been checked. If all available sets of points have not been checked (i.e. if there are some remaining sets of points to check), a determination is made in block 138, by examining the "Next" variable associated with the set of points i within the TPI, of whether the set of points following set of points i has already been determined. If it has, a new set of points i is chosen by incrementing the loop counter i in step 140. If the following set of points has not yet been determined, the Exit flag is reset in step 142, indicating that the loop is not yet to be exited.

From this point, an optimum new next move candidate j will be matched with the set of points i which has been chosen. The loop reference j is initialized in step 144. Next, in step 146, a determination is made of whether all next move candidates j have been checked. If they have not, a determination is made in step 148 of whether the next move candidate j has been linked, by checking the "Prev" and "Next" variables associated with the next move candidate j within the TPI. If this next move candidate j has been linked, the NotAvailable count is incremented in step 150, and j is incremented in step 152 to begin an attempt to match a new next move candidate j with the set of points i. On the other hand, if the next move candidate j being examined has not been linked, a determination is made in step 154 of whether the next move candidate j is within the current range (i.e. of whether the next move candidate j has a weighted distance from the set of points i less than the "CurrentRange" variable established in step 128). If the next move candidate j is not in this range, j is incremented in step 152 to examine a new next move candidate j.

If the next move candidate j has not been linked, in block 156 it is linked with the set of points i. In the TPI, the "Next" variable associated with the set of points i is set to point to the next move candidate j, and the "Prev" variable associated with the next move candidate j is set to point to the set of points i. In this way, an indication is provided that this set of points is now used, being not available for future attempts to link, and a reduction in the number of sets of points remaining to process is indicated by decrementing the "NumToProcess" variable. From this point, the Optimization Algorithm must continue by linking a new set of points to this next move candidate j, the loop reference i is set equal to j.

Returning to step 146, if all of the sets of points j for the particular point i being considered have been checked, it is obvious that the process cannot find a next move candidate j to link with i. Therefore, the process proceeds by going to the next i in step 140. However, before this occurs, a determination is made in step 158 of whether the "NotAvailable Count" equals the "NumBestPoints." If these numbers are equal, there are no more points to link with j, so the "NotSetCount" is incremented in step 160, indicating that there is one more set of points that cannot be linked using the sets of points available.

Returning to step 132, if all of the sets of points i and associated points j have been checked, it is obvious that this Second Pass of the Optimization Algorithm cannot proceed without getting more sets of points with which to work. This condition can be reached when the process is finished, with all points linked, or when the linkage has occurred in a manner using up all of the sets of points which can be linked with one of the remaining sets of points to be linked. This problem can occur because of the limitation which has been placed on the intermediate table associated with the set of points. Since this table started the Second Pass holding only the ten best next move candidates, it is possible that all of these candidates are linked to other sets of points before any next move candidate is linked to one of the set of points being considered. Thus, a determination is made in step 162 of whether the variable "NotSetCount" equals the variable "NumToProcess." "NotSetCount" indicates the number of sets of points i without alternatives, being incremented in step 160 as explained above. "NumToProcess" indicates the number of sets of points remaining. If these variables are equal, more sets of points are needed to link with the sets of points which cannot presently be linked. Therefore, the First Pass of the Optimization Algorithm is called in step 164, and is executed to provide more next move candidates j.

In any case, a determination is then made in step 120 of whether all points have been linked. If they have, the process of linking sets of points is successfully completed. In step 121, the sets of points are traversed in the order in which they are linked, starting with the initial set of points and using the "Next" variable to locate each successive link. As this is done, an output list is built, listing the sets of points in the order determined by the Optimization Algorithm. Finally, the process of this Algorithm is stopped in step 121.

FIG. 8 is an exploded isometric view of a fixture applying probe testing to both sides of a substrate 172, such as a circuit card, which is inserted into an intermediate position within a tester frame 176. by means of a card holder 178 in a support plate 180. A pair of upper gantry structures 182 move along the frame 176 above the substrate 172 the Y-direction of arrow 184, while a pair of lower gantry structures 186 move along the frame 176 below the substrate 172 in the X-direction of arrow 188. Each gantry structure 182 or 186 includes a carriage 190, which moves along the gantry structure in the direction perpendicular to the motion of the gantry structure itself. The gantry structures 182 and 186 are similar except for orientation. In this way, two upper probes 192 and two lower probes 194 are moved along the upper and lower surfaces, respectively, of substrate 172. Each probe 192 or 194 is mounted to its associated carriage 190 by means of a probe mounting structure 196, which includes vertical drive means to move the probe into and out of contact with substrate 172. Each gantry structure 182 is moved by means of a pair of linear motors 198 sliding in a channel 200 having a number of permanent magnets aligned with alternating polarities. Each carriage 190 is moved by means of a linear motor 202 sliding in a magnet channel 204 also having a number of permanent magnets aligned with alternating polarities. A more complete description of this test fixture is found in the cross-referenced U.S. application, Ser. No. 176,810, filed Jan. 3, 1994.

For use with the fixture of FIG. 8, data input to the Optimization Algorithm is provided in the following format:

TP[i]XUFrom, TP[i]YUFrom, TP[i]XUTo, TP[i]YUTo, TP[i]XLFrom, TP[i]YLFrom, TP[i]XLTo, TP[i]YLTo.

In this format, the positions of the two upper probes 192 are indicated by including the letter "U," while the positions of the two lower probes 194 are indicated by including the letter "L." When the Optimization Algorithm is applied to this data, the weighted distances travelled by the four probes between a set of four points i and a set of four points j under consideration as a next move candidate are given by the following equations:

$$deltaXUFrom = XU\_WEIGHTING \times (TP[i]XUFrom - TP[j]XUFrom) \quad 7)$$

$$deltaYUFrom = YU\_WEIGHTING \times (TP[i]YUFrom - TP[j]YUFrom) \quad 8)$$

$$deltaXUTo = XU\_WEIGHTING \times (TP[i]XUTo - TP[j]XUTo) \quad 9)$$

$$deltaYUTo = YU\_WEIGHTING \times (TP[i]YUTo - TP[j]YUTo) \quad 10)$$

$$deltaXLFrom = XL\_WEIGHTING \times (TP[i]XLFrom - TP[j]XLFrom) \quad 11)$$

$$deltaYLFrom = YL\_WEIGHTING \times (TP[i]YLFrom - TP[j]YLFrom) \quad 12)$$

$$deltaXLTo = XL\_WEIGHTING \times (TP[i]XLTo - TP[j]YLTo) \quad 13)$$

$$deltaYLTo = YL\_WEIGHTING \times (TP[i]YLTo - TP[j]YLTo) \quad 14)$$

The weighting factors are determined in the general manner described above in reference to FIG. 2. Each upper probe 192 is moved in the X-direction of arrow 188 by moving an associated carriage 190 and in the Y-direction of arrow 184 by moving an entire gantry structure 182, including the carriage 190. Each lower probe 196 is moved in the X-direction by moving only a carriage 190 and in the Y-direction by moving an entire gantry structure 186, including a carriage 190. These conditions indicate that the weighting factors YU_WEIGHTING and XL_WEIGHTING are larger than the weighting factors XU_WEIGHTING and YL_WEIGHTING. However, the use of two linear drive motors 198 to move each gantry structure 182 and 186, while only a single linear drive motor 202 is used to move each carriage 190, tends to reduce the additional time required to move the gantry structures. Thus, if sequencing is not required, the current maximum weighted distance is given by:

$$CurrentMax = MAXIMUM(deltaXUFrom, deltaYUFrom, deltaXUTo, deltaYUTo, deltaXLFrom, deltaYLFrom, deltaXLTo, deltaYLTo) \quad 15)$$

Because it is often unnecessary to move all probes in both directions, one or more of these terms may be equal to zero.

A method for determining the validity of a set of test points is based on the particular test fixture configuration of FIG. 8. Both of the upper gantry structures 182 travel with their linear drive motors 198 in common slots 200. Thus, one of the upper probes 192 is always to the rear, in the Y-direction of arrow 184, relative to the other upper probe 192. Similarly, both of the lower gantry structures 186 travel with their linear drive motors 198 in common slots (not shown). One of the lower probes 194 is always to the right, in the X-direction of arrow 188, relative to the other lower probe 194. A set of test points is valid if the following conditions are met:

$$TP[i]XLFrom \neq TP[i]XLTo \quad 16)$$

$$TP[i]YUFrom \neq TP[i]YUTo \quad 17)$$

These relationships are based on the lower probe providing the "From" side of measurements being on the left of the other lower probe, and on the upper probe providing the "From" side of measurements being in front of the other upper probe. The equality conditions are retained to allow the upper probes to be used to measure circuits extending between points separated in the X-direction but not in the Y-direction, and to allow the lower probes to be used to measure points separated in the Y-direction but not in the X-direction. Provisions for detecting the placement of probes too close together are not required because of the application of probe collision avoidance code during the operation of the test fixture.

Sequencing is required during the movement of probes from a set of points i to a next move candidate j if any one of the following conditions is met:

$$TP[j]XLFrom > TP[i]XLTo \quad 18)$$

$$TP[j]YUFrom > TP[i]YUTo \quad 19)$$

Since there may be a need to complete sequential movements of both upper and lower probes, the general equation for the current maximum weighted distance under conditions requiring sequencing is given by the following equation:

$$\begin{aligned}
\text{"CurrentMax"} = \text{MAXIMUM} \quad & 20) \\
\{(\text{Sequence } 1U \text{ Delta } Y + \\
\text{Sequence } 2U \text{ Delta}Y), \\
(\text{Sequence } 1L \text{ Delta}X + \\
\text{Sequence } 2L \text{ Delta}X), \\
\text{Delta}XU\text{From, Delta}XU\text{To,} \\
\text{Delta}YL\text{From,Delta}YL\text{To}\}
\end{aligned}$$

Thus, the maximum weighted distance is the greatest of the sequenced delay from the upper probes (requiring two movements in the Y-direction), the sequenced delay from the lower probes (requiring two movements in the X-direction), and the travel times not requiring sequencing (i.e. the movement of upper probes in the X-direction and of lower probes in the Y-direction).

In the operation of the test fixture, two probes are generally brought into simultaneous contact with the substrate 172 to measure the electrical characteristics of a circuit extending along or through the card 172. Thus, the two upper probes 192 may be used to measure the characteristics of a circuit extending between two points on the upper surface of the card 172. The two lower probes 194 may be used to measure the characteristics of a circuit extending between two points on the lower surface of the card 172. One of the upper probes 192 and one of the lower probes 194 may be used to measure the characteristics of a circuit extending through the card 172. Thus, it is possible to consider the movement of only two probes at a time, unless sequencing is required.

However, if the probes not being used for an upcoming measurement are not moved, the position of these probes will become indeterminate as the various sets of points are reordered by the optimization program. Therefore, probes which are not used are preferably moved to a "home" position, from which a future move can be made as needed. The location of home positions for each of the four probes must be implemented as the various sets of points are chosen and listed, before the operation of the optimization program.

A home position may be chosen to provide a point central to the area in which a certain probe operates, minimizing the distance which must be travelled when the probe must subsequently be moved. Alternately, the home position may be chosen to move the probe well away from the area through which the other upper or lower probe moves, minimizing a need for sequencing in subsequent moves during the testing process, or the home position may be placed at a test point accessing a ground or voltage plane in the substrate 172, so that, without subsequent movement, this probe can be subsequently used to make measurements of capacitance between such a plane and various circuits. In many cases a point may be found combining some or all of these characteristics.

The algebraic relationships discussed above in reference to FIG. 8 are applied to the method previously discussed in reference to FIGS. 4 and 5 to order the sets of points provided as an input to the Optimization Algorithm. The output of this algorithm is provided in the form of an ordered, optimized list of sets of points. Each line in this list describes the locations of four points (i.e. of the two upper probes and the two lower probes) in the form of eight X- and Y-coordinates.

Figure 9:
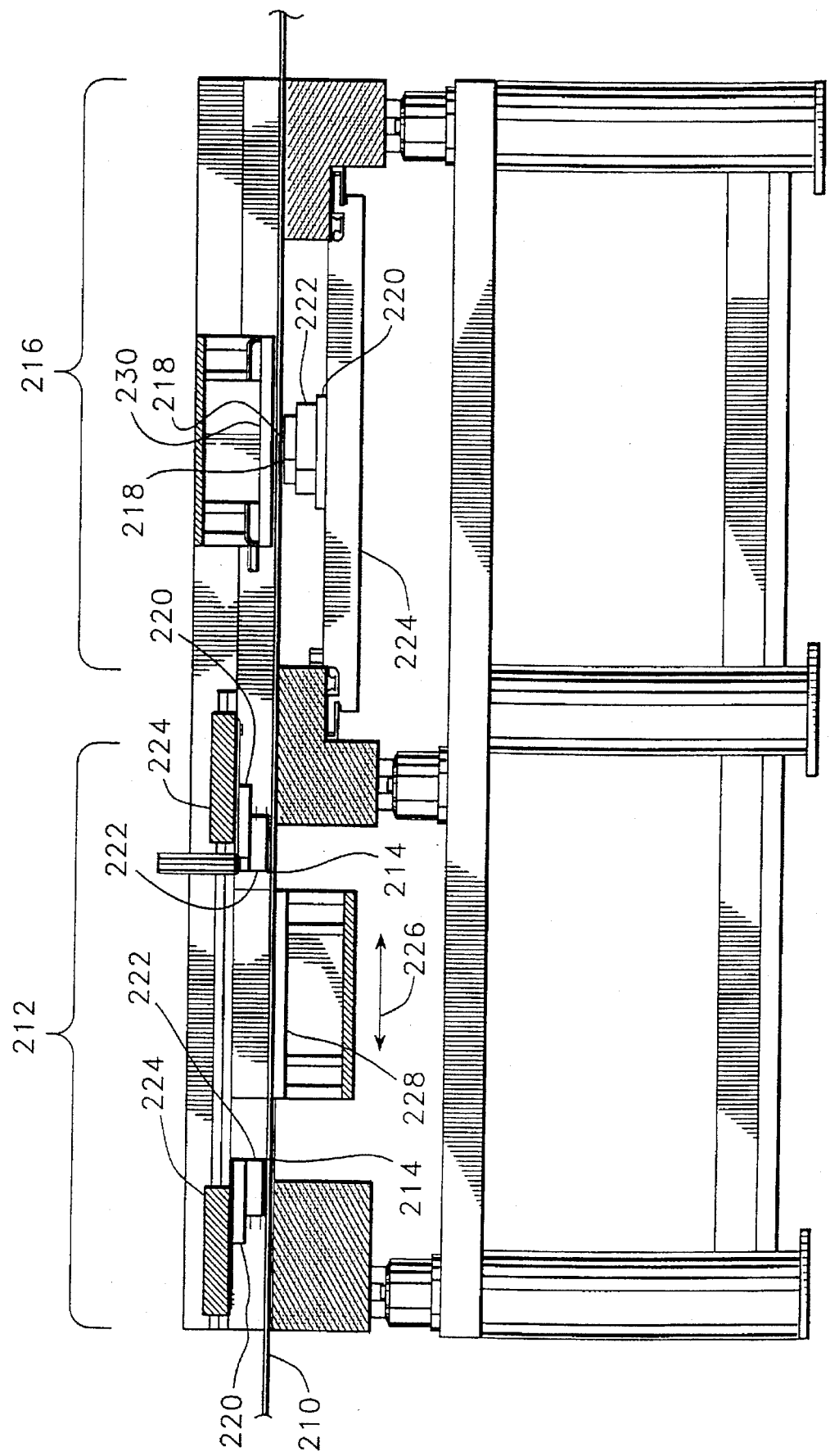
FIG. 9 is a partly sectional front elevational view of a second alternative fixture to which the algorithm of FIGS. 4 and 5 is applied.

FIG. 9 is a partly sectional front elevational view of a fixture applying probe testing to both sides of a flexible substrate fed through the fixture as a web 210. The fixture includes a first section 212, in which two upper probes 214 travel above the upper surface of the web 210, and a second section 216, in which two lower probes 218 travel below the lower surface of the web 210. Each probe 214 or 216 is mounted to a carriage 220 by a probe mounting structure 222, which drives the probe up and down, into and out of contact with web 210. Each carriage 220 travels along a gantry structure 224. In first section 212, the gantry structures 224 move longitudinally along the web 210, in the direction of arrow 226. In second section 216, the gantry structures 224 move transversely across the web. The gantry, carriage, and probe structures are similar to corresponding structures previously described in reference to FIG. 8. Separate means (not shown) are used to move the web 210 longitudinally, incrementally exposing various circuit patterns in fixture sections 212 and 216. Backing plates 228 and 230 provide mechanical support for the probing process, which pushes against the web 210, while also providing means for testing circuits extending through web 210 and for performing single-probe circuit inductance testing relative to an external ground plane. A more thorough description of this test fixture is found in the cross-referenced application, Ser. No. 287,313, filed Aug. 8, 1994.

A series of identical circuit patterns to be tested are preferably placed at equal intervals along the web 210, so that, within one circuit pattern, circuits having upwardly-exposed test points are tested in fixture section 212, while, within another circuit pattern, circuits having downwardly-exposed test points are tested in fixture section 16.

The test fixture segments 212 and 216 are handled independently as the Optimization Algorithm is applied to the test fixture of FIG. 9. Data input to the algorithm consists of two lists. A first list of sets of test point locations for the upper probe has the following format:

TP[i]XUFrom, TP[i]YUFrom, TP[i]XUTo, TP[i]YUTo

A second list of sets of test point locations for the lower probe has the following format:

TP[i]XLFrom, TP[i]YLFrom, TP[i]XLTo, TP[i]YLTo

Equations 7–10, previously described in reference to FIG. 8, are used to develop the deltas for the upper probes from the data of the first list. Equations 11–14 are used to develop the deltas for the lower probes from the data of the second list.

These processes are accomplished in sequentially separate applications of the data to the Optimization Algorithm, with the first application being used to reorder the first list of sets of upper probe locations, and with the second application being used to reorder the second list of lower probe locations. In the first of these applications, and in the absence of a need for sequencing, the current maximum weighted distance is given by the maximum value of equations 7 through 10. In the second of these applications, also without sequencing, this distance is given by the maximum value of equations 11 through 14. In the first and second of these applications, the validity of sets of test points are indicated by expressions 16 and 17, respectively, and a need for sequencing is indicated by expressions 18 and 19, respectively. If sequencing is required in the first application, the current weighted maximum distance is given by:

$$\text{CurrentMax}=\text{MAXIMUM}(\text{Sequence 1U DeltaY}+\text{Sequence 2U DeltaY}), \text{DeltaXUFrom}, \text{DeltaXUTo}) \quad 21)$$

If sequencing is required in the second application, the current weighted maximum distance is given by:

$$\text{CurrentMax}=\text{MAXIMUM}(\text{Sequence 1L DeltaX}+\text{Sequence 2L DeltaX}), \text{DeltaYLFrom}, \text{DeltaYLTo}) \quad 22)$$

While the types of test fixtures described above in reference to FIGS. 2, 8 and 9 can be used to perform single-probe test procedures, as only one of the various probes in the fixture is brought into contact with the substrate being tested, this type of testing often justifies the use of a test fixture having only one probe.

Figure 10:
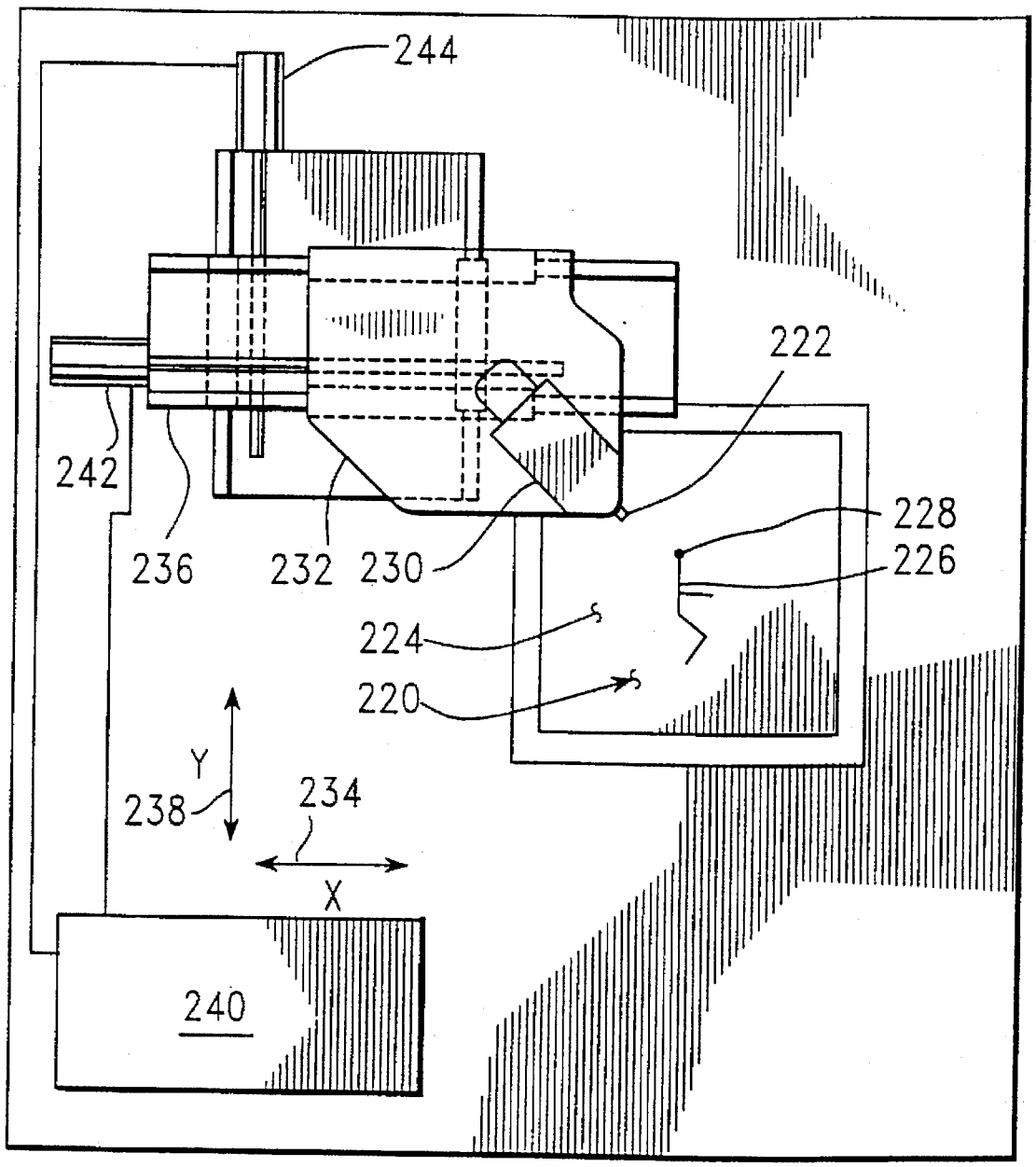
FIG. 10 is a plan view of a single-probe fixture used to test the substrate of FIG. 1, operating in accordance with the subject invention.

Thus, FIG. 10 is a plan view of a fixture for testing a substrate 220 using a single probe 222 moved along an upper surface 224 of the substrate. The testing of an individual circuit 226, extending along the substrate 220, takes place as the probe 222 is brought into contact with a test point 228 electrically connected to the circuit 226. During this testing, the capacitance between the test point 228 and a conductive plane (not shown) within or under the substrate is measured. This type of testing is particularly useful in determining whether a short circuit connects the circuit 226 to an adjacent circuit (not shown). Such an inadvertent connection increases the capacitance between circuit 226 and the conductive plane (not shown). The probe 222 is mounted on a probe carrier 230, which is in turn mounted on an X-stage 232, sliding in the X-direction of arrow 234 on Y-stage 236. This Y-stage 236 slides in the Y-direction of arrow 238. An electronic controller 240 moves the probe 222 in the X- and Y-directions by powering X-drive motor 242 and Y-drive motor 244, respectively. Various details of the mechanical drives are similar or identical to the drives described in greater detail in reference to FIG. 2 to move a single probe 10 or 12.

The Optimization Algorithm is used to determine an optimum sequence of movements of the single probe 222. Each entry in the Test Point Data Structure (TP) describes the X- and Y-coordinates of a single probe position required for a measure, having the following format:

TP[i]X, TP[i]Y

The weighted distances in the X- and Y-directions between a point i and a next move candidate j are given by the following equations:

$$\text{deltaX} = \text{X\_WEIGHTING} \times (\text{TP}[i]\text{X} - \text{TP}[j]\text{X}) \qquad 23)$$

$$\text{deltaY} = \text{Y\_WEIGHTING} \times (\text{TP}[i]\text{Y} - \text{TP}[j]\text{Y}) \qquad 24)$$

In this configuration, sequencing is never required, so the current weighted maximum distance is given by the maximum value obtained in equations 23 and 24, according to the following equation:

$$\text{"CurrentMax"} = \text{MAXIMUM}(\text{deltaX}, \text{deltaY}) \qquad 25)$$

Thus, a number of particular advantages of the Optimization Algorithm are retained as the present invention is applied to various circuit tester configurations. The use of a weighted distance for the variable "CurrentMax" allows the system to be optimized according to the degree of difficulty in probe movement from each set of points to a next move candidate. The weighting factors may reflect the time required to move in one direction instead of another, or other factors, such as the mechanical wear of probe moving mechanisms, may be considered. The use of a subroutine to detect a need for sequencing, and the method provided for varying the calculation of the weighted distance when this need is detected, greatly increase the accuracy of the optimization process. The use of an intermediate table for each set of points, listing next move candidates, greatly reduces the memory requirements and processing time for a typical circuit test application.

While the invention has been described in its preferred forms or embodiments with some degree of particularity, it is understood that this description has been given only by way of example and that numerous changes may be made without departing from the spirit and scope of the invention.

What is claimed is:

1. A method for optimizing a sequence of test configurations within a circuit tester having structures movable between various of said test configurations, wherein said method comprises the steps of:

reading an input list of said test configurations;

for each test configuration within said input list, establishing each other of said test configurations as a next move candidate, calculating a weighted distance from said test configuration to said next move candidate, wherein said weighted distance reflects a degree of difficulty in movement of said structures within said circuit tester from said test configuration to said next move candidate, and storing an intermediate list having a maximum of a predetermined number of next move candidates, wherein said intermediate list includes said next move candidates with lowest weighted distances from said test configuration, and wherein said predetermined number is less than a total number of test configurations in said input list; and linking said test configurations into a chain, in a preferred order beginning with an initial said test configuration, wherein each said test configuration following said initial test configuration is chosen from available next move candidates within said intermediate list of a test configuration at an end of said chain, wherein when a said next move candidate is linked, said next move candidate is removed from said available next move candidates, and wherein, until all said test configurations are linked, when said next move candidates have been exhausted from said intermediate list of said test configuration at said end of said chain, an additional said next move candidate is added to said intermediate list of said test configuration at said end of said chain.

2. The method of claim 1:

wherein said method comprises in addition, following said step of calculating a weighted distance, a step of determining a pitch variable representative of a minimum value of said weighted distance by replacing a value of said pitch variable with a value of said weighted distance whenever said weighted distance is less than said pitch variable;

wherein said method comprises in addition, before said step of linking said test configurations into a chain; a step of calculating a range of weighted distances by multiplying said pitch variable by a multiplier;

wherein, during said step of linking said test configurations into a chain, each said test configuration following said initial test configuration is chosen from next move candidates having weighted distances within said range of weighted distances; and wherein, whenever said additional next move candidate is added to said intermediate list, said multiplier is increased in value and a new range of weighted distances is calculated by multiplying said pitch variable by said multiplier.

3. The method of claim 1:

wherein, for each said test configuration, said next move candidates are stored in said intermediate list in a sequentially increasing order of said weighted distance to said next move candidates from said test configuration; and wherein, during said step of linking said test configurations into a chain, said next move candidates are selected in said sequentially increasing order.

4. The method of claim 1, wherein said step of linking said test configurations includes a step of defining a next variable associated with each said test configuration to indicate a next move candidate linked to said test configuration and following said test configuration in said preferred order.

5. The method of claim 4, wherein said step of linking said test configurations additionally includes a step of traversing said test configurations sequentially according to said next variables associated therewith to construct aa output list of said test configurations in said preferred order.

6. The method of claim 1, wherein said weighted distance is calculated to form a value indicating a time required to move said structures within said circuit tester from positions defined by said test configuration to positions defined by said next move candidate.

7. The method of claim 6:

wherein each said test configuration specifies a position of a single probe included in said structures; and wherein said weighted distance is calculated to form a value indicating a time required to move said single probe from a position indicated by said test configuration to a position indicated by said next move candidate, said single probe being driven by X- and Y-directional drives operating perpendicularly to one another, said weighted distance being derived from a longer of first and second times, said first time being a time required for operation of said X-directional drive, and said second time being a time required for operation said Y-directional drive.

8. The method of claim 7, comprising in addition a step of driving said single probe sequentially between positions represented by said test configurations in said preferred order.

9. The method of claim 6:
wherein each said test configuration specifies positions of a plurality of probes included in said structures; and
wherein said step of calculating a weighted distance includes a determination of whether one probe movement must be made before another to avoid a collision of said probes and of associated structures moving with said probes, with said weighted distance being calculated as a sum of sequential probe movement distances as said probes are moved within said circuit tester from said positions defined by said test configuration to said positions defined by said next move candidate when one probe movement must be made before another, and with said weighted distance being calculated according to a longest time required to move a said probe as various of said probes are moved within said circuit tester from said positions defined by said test configuration to said positions defined by said next move candidate when said probe movements may occur simultaneously without collision of said probes and of said associated structures.

10. The method of claim 9, wherein a time required to move each said probe is derived from the longer of first and second times, said first time being a time required for operation of an X-directional drive moving said probe in an X-direction, and said second time being a time required for operation of a Y-directional drive moving said probe in a Y-direction, perpendicular to said X-direction.

11. The method of claim 10, comprising in addition a step of driving said probes sequentially between positions represented by said test configurations in said preferred order.

12. Apparatus for testing electrical circuits on a substrate, wherein said apparatus comprises:
clamping means holding said substrate in a fixed location;
a probe movable from a location defined by a first test configuration to a location defined by another test configuration;
data processing means including data reading means;
a first input list of test configurations, read by said data reading means, wherein each test configuration within said first input list describes a location of said probe during a test procedure within said apparatus;
a program executing on said data processing means, wherein said program includes a first pass subroutine reading said first input list, and, for each said test configuration, establishing each other of said test configurations as a next move candidate, calculating a weighted distance from said test configuration to said next move candidate, storing an intermediate list having a maximum predetermined number of next move candidates, said predetermined number being less than a total number of test configurations in said input list, with said intermediate list including said next move candidates with lowest weighted distances from said test configuration, wherein said program additionally includes a second pass subroutine linking said test configurations into a chain, in a preferred order beginning with an initial said test configuration, with each test configuration being chosen from available next move candidates within said intermediate list of a test configuration at an end of said chain, with said next move candidates being removed from availability as they are linked to said chain, and with said second pass subroutine calling said first pass subroutine to refill said intermediate list when next move candidates have been exhausted from said intermediate list of said test configuration at said end of said chain; and
means for moving said probe between positions indicated by said test configurations in said preferred order.

13. The apparatus of claim 12:
wherein, after said weighted distance has been calculated, said weighted distance is compared with a pitch variable, with said pitch variable being replaced by said weighted distance if said weighted distance is smaller than said pitch variable;
wherein, before said test configurations are linked into a chain, a range of weighted distances is calculated, multiplying said pitch variable by a multiplier;
wherein, each said test configuration following said initial test configuration is chosen for linking from said next move candidates having weighted distances within said range of weighted distances; and
wherein, whenever said second pass subroutine executes a single cycle, said multiplier is increased in value and a new range of weighted distances is calculated by multiplying said pitch variable by said multiplier.

14. The apparatus of claim 13:
wherein, for each said test configuration, said intermediate list holds said next move candidates in a sequentially increasing order of said weighted distance from said test configuration; and
wherein, within said second pass subroutine, as said next move candidates are linked into a chain, said next move candidates are selected in said sequentially increasing order.

15. The apparatus of claim 12, wherein said test configurations are linked during said second pass routine as a next variable associated with each said test configuration is given a value to indicate a following next move candidate linked to said test configuration.

16. The apparatus of claim 15, wherein after said test configurations are linked, additionally, said test configurations are traversed using each said next variable as an output list of test configurations sequentially ordered in said preferred order is formed.

17. The apparatus of claim 12, wherein said weighted distance is calculated to form a value indicating a time required to move said probe within said circuit tester from a position defined by said test configuration to a position defined by said next move candidate.

18. The apparatus of claim 17,
wherein said means for moving said probe includes X- and Y-directional drives operating perpendicularly to one another, moving said probe according to a resultant of motions from said X- and Y directional drives; and
wherein said weighted distance being derived from a longer of first and second times, said first time being a time required for operation of said X-directional drive, and said second time being a time required for operation said Y-directional drive.

19. The apparatus of claim 12:
wherein said apparatus comprises a plurality of said probes movable from said locations defined by a first test configuration to said locations defined by another test configuration; and
wherein each said test configuration within said first input list describes a location of each said probe during said test procedure within said apparatus.

20. The apparatus of claim 19, wherein, before said weighted distance is calculated, a determination is made of whether one probe movement must occur before another to avoid a collision of said probes and of associated structures moving with said probes, with said weighted distance being calculated as a sum of sequential probe movement distances as said probes are moved within said circuit tester from said positions defined by said test configuration to said positions defined by said next move candidate when one probe movement must be made before another, and with said weighted distance being calculated according to a longest time required to move a said probe as various of said probes are moved within said circuit tester from said positions defined by said test configuration to said positions defined by said next move candidate when said probe movements may occur simultaneously without collision of said probes and of said associated structures.

21. The apparatus of claim 20, wherein a time required to move each said probe is derived from the longer of first and second times, said first time being a time required for operation of an X-directional drive moving said probe in an X-direction, and said second time being a time required for operation of a Y-directional drive moving said probe in a Y-direction, perpendicular to said X-direction.

22. The apparatus of claim 19, wherein said plurality of probes includes a first pair of independently movable probes contacting a first side of said substrate.

23. The apparatus of claim 22:
   wherein said plurality of probes includes a second pair of independently movable probes contacting a side of said substrate opposite said first side; and
   wherein each said test configuration includes points locating four said probes during a test procedure.

24. The apparatus of claim 19:
   wherein said first pair of independently movable probes and first stages moving with said first pair of movable probes move with a first space;
   wherein said plurality of probes additionally includes a second pair of independently movable probes contacting said substrate in a region displaced along said substrate from said first pair of independently movable probes, so that said first said second pair of independently movable probes and second stages moving with said second pair of movable probes move within a second space separated from said first space, and so that circuits contacted by said second pair of independently movable probes are separated from circuits on said substrate simultaneously contacted by said first pair of independently movable probes;
   wherein said apparatus additionally includes a second input list of test configurations, read by said data reading means, with each test configuration within said second input list describing simultaneous locations of said second pair of independently movable probes during a test procedure using said second pair of independently movable probes; and
   wherein said program is executed a first time with data input from said first input list to link test configurations from said first input list and a second time with data input from said second input list to link test configurations from said second input list.

* * * * *